(12) United States Patent
Chen

(10) Patent No.: US 7,257,040 B2
(45) Date of Patent: Aug. 14, 2007

(54) FAST PRE-CHARGE CIRCUIT AND METHOD OF PROVIDING SAME FOR MEMORY DEVICES

(75) Inventor: Chung-Kuang Chen, Banciao (TW)

(73) Assignee: Macronix International Co., Ltd. (TW)

( * ) Notice: Subject to any disclaimer, the term of this patent is extended or adjusted under 35 U.S.C. 154(b) by 149 days.

(21) Appl. No.: 11/236,347

(22) Filed: Sep. 27, 2005

(65) Prior Publication Data

US 2007/0070744 A1    Mar. 29, 2007

(51) Int. Cl.
*G11C 7/00* (2006.01)
(52) U.S. Cl. ..................... 365/203; 365/204
(58) Field of Classification Search ............... 365/203, 365/204, 190, 189.06, 189.11
See application file for complete search history.

(56) References Cited

U.S. PATENT DOCUMENTS

| | | | |
|---|---|---|---|
| 5,805,515 A * | 9/1998 | Suzuki | 365/203 |
| 6,298,003 B1 * | 10/2001 | Chou | 365/230.06 |
| 6,661,721 B2 | 12/2003 | Lehmann et al. | |
| 6,717,872 B2 * | 4/2004 | Ishida | 365/203 |
| 6,724,672 B2 | 4/2004 | Nirschl | |
| 2005/0201168 A1 * | 9/2005 | Sugahara et al. | 365/203 |

\* cited by examiner

*Primary Examiner*—Vu A. Le
(74) *Attorney, Agent, or Firm*—Baker & McKenzie LLP

(57) ABSTRACT

A fast pre-charge circuit and method of providing a fast pre-charge for an integrated circuit memory device is disclosed. The fast pre-charge circuit comprises an address calculating unit and a multi-power driver. The address calculating unit detects the sector distance from driver of the integrated circuit memory device, and the driver provides a voltage to the loading of the integrated circuit memory device based on an output of the address calculating unit. Unlike a conventional fixed-power wordline driver, the driver of the present invention provides multiple voltage levels to the wordline or dynamically adjusts for different loading situations.

34 Claims, 4 Drawing Sheets

FAST PRE-CHARGE CIRCUIT AND METHOD OF PROVIDING SAME FOR MEMORY DEVICES

BACKGROUND OF THE INVENTION

1. Field of the Invention

The present invention relates to a fast pre-charge circuit and method of providing a fast pre-charge for an integrated circuit memory device.

2. Description of the Related Art

In recent years, the size of integrated circuit devices continues to decrease resulting in considerable increase of the packing densities for these devices. The performance of the integrated circuit devices also improves as a result while the manufacture costs have gone down as well.

However, the performance of denser integrated circuit devices could drop when smaller process parameters are used. Accordingly, the issue of maintaining or controlling the precision of contact windows is particularly important as the density of integrated circuit devices continues to increase for future generations of these devices. This etching control issue is even more critical for integrated circuit devices with multiple polysilicon layers. Therefore, a so-called self-aligned contact (SAC) process which can reduce contact area is developed to deal with this issue.

Referring now to FIG. 1, there is shown a block diagram of a portion of an integrated circuit memory device. The integrated circuit memory device 100 typically includes at least a memory controller, and a plurality of memory banks. Each of the memory banks has wordlines or rows ($R_1$, $R_2$, ... $R_n$) and bitlines or columns ($C_1$, $C_2$, ... $C_n$). A local pre-charge control unit 102 incorporated with a wordline control 140 and a bitline control 130 is used to control the read/write of the memory cells. Typically, the wordline control 140 controls the active and de-active operations of each row of the memory array, while the bitline control 130 controls the read, write and equalize operations of each column to the memory array.

Before the activation of a wordline and accessing of the memory array, the precharge circuit charges all bitlines to a predetermined potential. Further, each bitline is shorted or equalized so that the bitlines are at an equal potential. The time required to precharge and equalize is often referred to as the precharge time or precharge period.

Referring now to FIG. 2, during the precharge stage, the potential of the wordline is also raised to a read wordline potential, typically the supply voltage $V_{DD}$ of the integrated circuit, or a higher voltage generated by charge pumps.

The conventional pre-charge circuit described above is affected by some problems.

One of the problems of the conventional pre-charge circuit depends on the electrical load offered by the wordlines. As shown in FIG. 2, each wordline is driven by a wordline drive power and can have a loading divided by several sections (1, 2, ... N) of loading. In the conventional wordline or bitline driver design, a constant driving voltage is provided by the wordline or bitline power driver through the whole wordline loading. Since wordline is made of polysilicon which has a higher resistance than the metal bitline, the poly wordline transient speed is especially low.

Therefore, in a high speed memory design, less wordline loading per one wordline driving circuit is often employed in often employed in order to solve the above mentioned problem. However, if one wordline driving circuit drives less wordline loading, then the memory will have to increase the number of the wordline driving circuits, causing the memory chip size and manufacturing cost to increase.

Therefore, there is still a need for a cost effective high speed precharge circuit which can effectively solve the above-mentioned problems of the prior art.

SUMMARY OF THE INVENTION

The present invention is directed to solve these and other disadvantages of the prior art. A fast pre-charge circuit and method of providing a fast pre-charge for an integrated circuit memory device is disclosed. Fast pre-charge is achieved by using multiple voltage offsets added to the voltage waveform of the power driver. Since the initial driver voltage is higher, the speed of the wordline driver according the present invention is greatly improved.

One aspect of the present invention contemplates a fast pre-charge circuit for an integrated circuit memory device. The fast pre-charge circuit comprises an address calculating unit and a power driver. The address calculating unit detects a loading of the integrated circuit memory device, and the driver provides a voltage to the loading of the integrated circuit memory device based on an output of the address calculating unit. Unlike the conventional fixed-power wordline driver, the driver of the present invention provides multiple voltage levels to the wordline or even dynamically adjusts for different loading situations.

Another aspect of the present invention provides a method of providing a power to a pre-charge circuit for an integrated circuit memory device. The method comprises the steps of decoding an address of a line to be provided the power, detecting a loading of the line and providing a voltage to the line based on the loading. Unlike the conventional fixed power wordline driver, the driver of the present invention provides multiple voltage levels to the wordline or even dynamically adjusts for different loading situations.

Yet another aspect of the present invention provides a method of providing a power to a pre-charge circuit for an integrated circuit memory device. The method comprises the steps of decoding an address of a wordline intended to be provided the power, detecting a loading of the wordline, and providing a voltage to the wordline based on the loading. Unlike the conventional fixed power wordline driver, the driver of the present invention provides multiple voltage levels to the wordline or even dynamically adjusts for different loading situations.

BRIEF DESCRIPTION OF THE DRAWINGS

The accompanying drawings are included to provide a further understanding of the present invention, and are incorporated in and constitute a part of the description to this invention. The drawings illustrate embodiments of the present invention, and together with the description, serve to explain the principles of the present invention. There is shown.

DESCRIPTION OF THE PREFERRED EMBODIMENT

The invention disclosed herein is directed to a fast pre-charge circuit and method of providing a fast pre-charge for an integrated circuit memory device. In the following description, numerous details are set forth in order to provide a thorough understanding of the present invention. It will be appreciated by one skilled in the art that variations of these specific details are possible while still achieving the results of the present invention. In other instances, well-known processing steps are not described in detail in order not to unnecessarily obscure the present invention.

Figure 1:
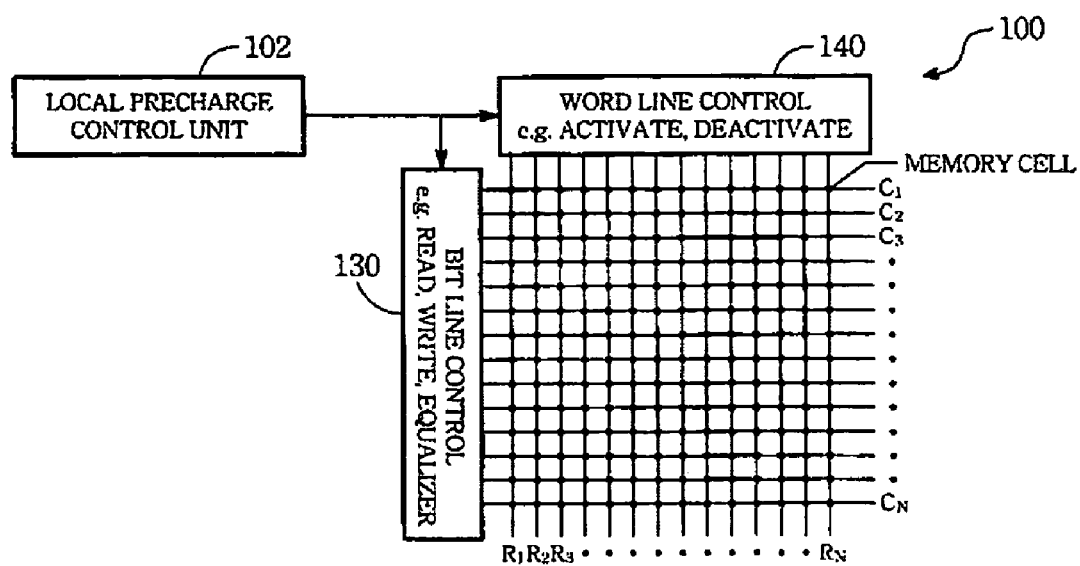
FIG. 1 is a block diagram illustrating an integrated circuit memory device according to the prior art.
Figure 2:
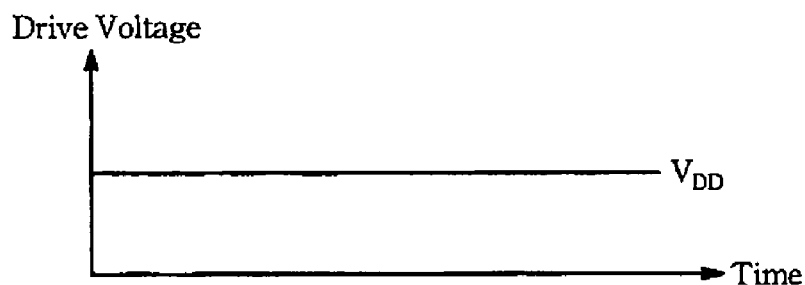
FIG. 2 is a constant power driver in the wordline transient according to the prior art.
Figure 3:
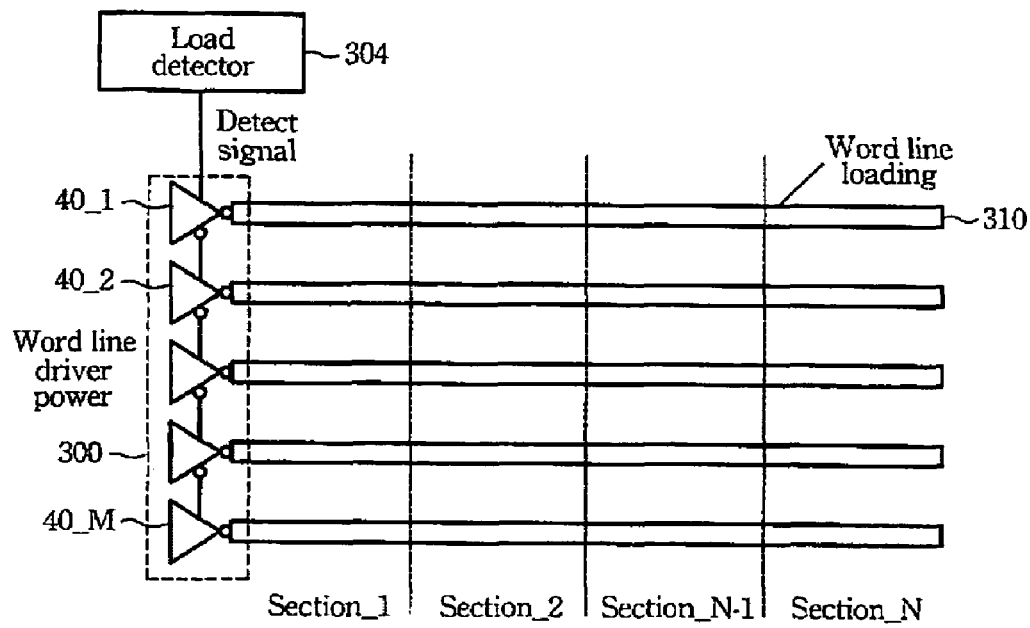
FIG. 3 is a block diagram representation of a pre-charge circuit of an integrated circuit memory device according to a preferred embodiment of the present invention.

FIG. 3 shows an application of the wordline multi-power regulator according to a preferred embodiment of the present invention. The wordline multi-power regulator 300 can be used to regularize the power generated by a plurality of wordline drives 40_1 to 40_M. Each of the wordline drivers 40_1 to 40_M, for example, the wordline driver 40_1, is used to send a variable drive voltage to a particular wordline 310 depending on its loading at a given time. This wordline can be divided into a plurality of sections of loadings. In the shown preferred embodiment, the wordline is deviled into N sections. A load detection unit 304 is used to detect a particular wordline 310 depending on its loading at a given time, then sends a detect signal output to the wordline multi-power regulator 300 to indicate the kind of the power that needs to be provided to the sections of the wordline 310.

Figure 8:
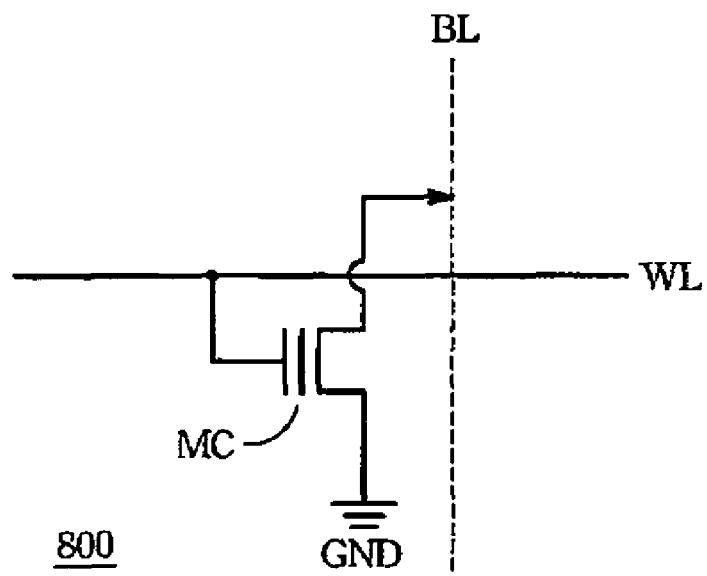
FIG. 8 shows an exemplary figure of a memory cell accessed through the wordline and the bitline according to an embodiment of the present invention.

FIG. 8 shows an exemplary figure of a memory cell (MC) 800 accessed through a wordline (WL) and a bitline (BL). Typically, N memory cells may be connected along one wordline WL representing N sections for the wordline driver. The source of each memory cell MC may be connected to other circuitries through its respective bitline BL. Therefore, the loading of one wordline WL may be varied for different sections, which are also driven by each section's bitline and the associated circuitries.

Figure 4:
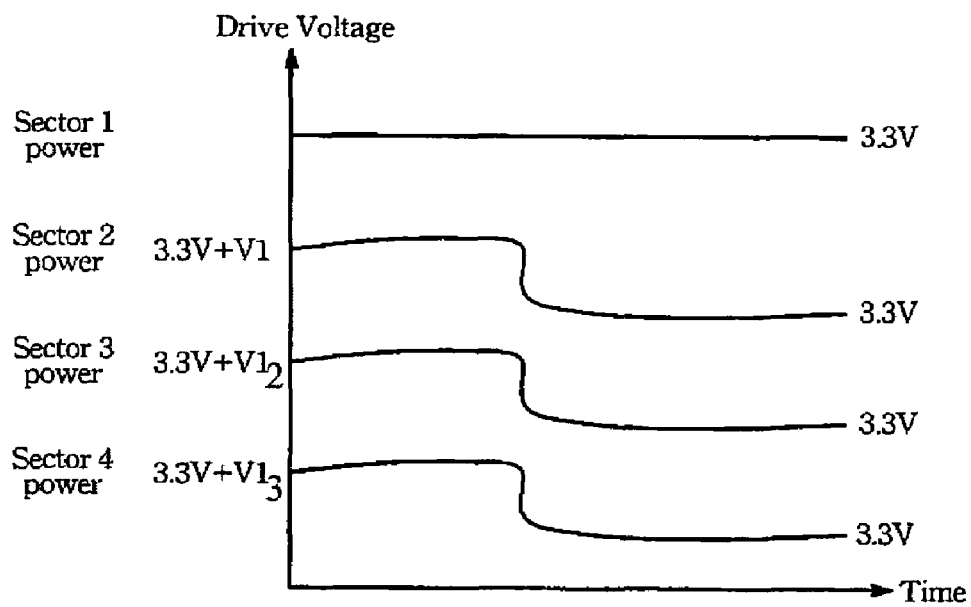
FIG. 4 is a driver power representation of a pre-charge circuit of an integrated circuit memory device which uses a different power for different sectors according to a preferred embodiment of the present invention.

In a preferred embodiment of the present invention, the wordline multi-power regulator 300 is configured to generate a predetermined waveform to drive the wordlines of different loading. The waveform can be characterized with a voltage offset Vi (i=1, 2, 3, etc.) with a steady state drive voltage V, as shown in FIG. 4. Since the loading at the beginning section is lower than toward the end of that wordline, a higher driving voltage is needed when loading also higher, then gradually decreases to the final drive voltage V. In one example, the steady state drive voltage V is equal to 3.3 V and the voltage offsets V1=V2=V3=0.3 volts. And the loading of the wordline is linearly and equally divided into four sections, therefore, the drive voltage is sector 1=3.3V, sector 2=3.6V, sector 3=3.9V, sector 4=4.2V. The voltage dependence with the loading can be of other types of relations, such as, squarely proportional with the distance 1:4:9:16, or even dynamically adjusts.

Figure 5:
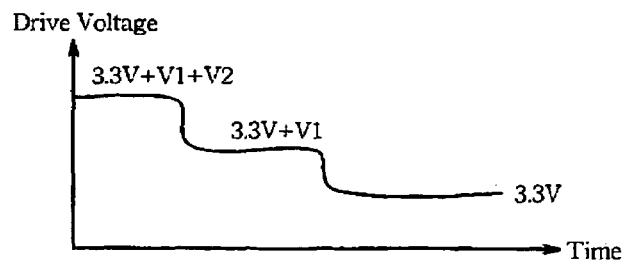
FIG. 5 is a driver power representation of a pre-charge circuit of an integrated circuit memory device which uses a steplike power for different sectors according to another preferred embodiment of the present invention.

Alternatively, the waveform can have multiple voltage offsets, as shown in FIG. 5. The voltage offsets can be selected according to the detection signal of the loading for the wordline sends from the load detection unit 304 as shown in FIG. 3. A higher voltage offset can be selected when the load is increased. For example, the voltage offset may be increased from V1 to V3 when the number of sections is increased in order to accommodate the increased load. Or a higher voltage is provided to the sectors with a longer distance from the driver in order to accommodate the increased load. Moreover, for sections with extreme loadings, multiple voltage offsets can be applied to those sections. For example, the voltage waveform for section N shown in FIG. 5 has multiple voltage offsets in stepwise manner.

Figure 7:
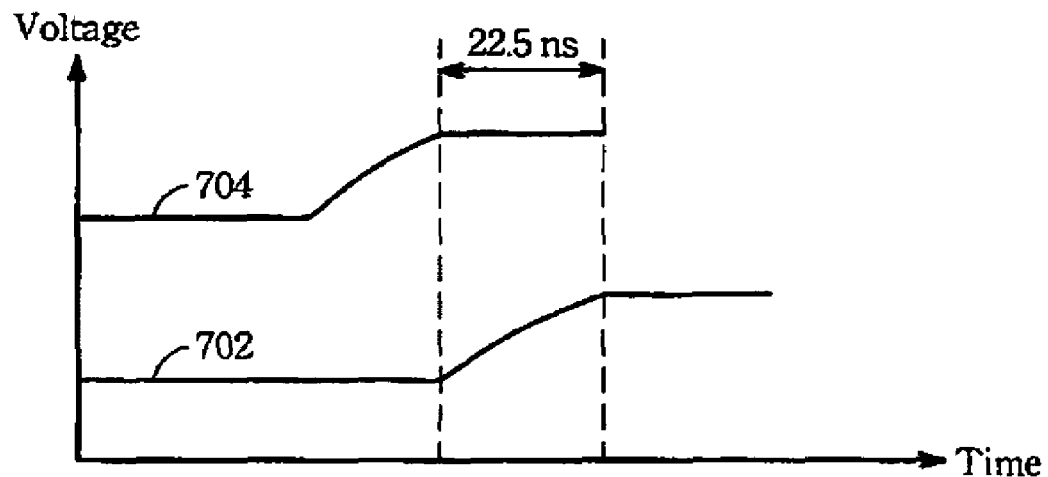
FIG. 7 shows the effects of the wordline multi-power regulator according to a preferred embodiment of the present invention.

FIG. 7 shows the effects of the wordline multi-power regulator according to a preferred embodiment of the present invention. Unlike the conventional fixed power wordline driver 702, which may need more time to pull the voltage up to its final steady state, with multiple voltage offsets of the present invention 704 added to the voltage waveform generated from regulator 300, the pre-charge speed could be enhanced. Since the initial driver voltage is higher, the speed of the wordline driver according the present invention is greatly improved. From the simulation result shown in FIG. 7, the pre-charge speed is improved by 22.5 ns. This is especially beneficial to high-speed applications.

Figure 6:
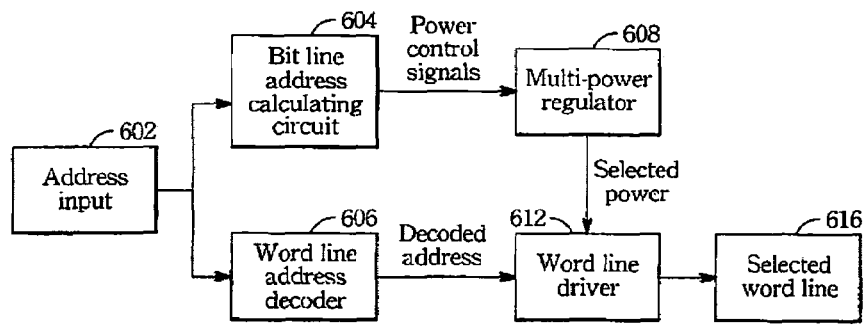
FIG. 6A is a block diagram illustrating how to provide a power to a selected bitline according to a preferred embodiment of the present invention.
FIG. 6B is a block diagram illustrating how to provide a power to a selected wordline according to another preferred embodiment of the present invention.
Figure 6:
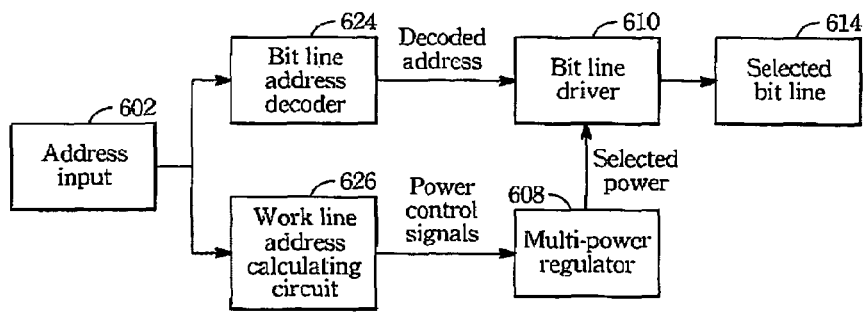

FIGS. 6A and 6B show the block diagrams of a memory pre-charge circuit using the multi-power regulator according to a preferred embodiment of the present invention. As shown in FIG. 6A, the memory pre-charge circuit comprises a bitline address calculating circuit 604 calculates a distance from the driver of wordline and sending power control signals based on the address input 602 to a multi-power regulator 608 and supply the selected power to the wordline driver 612. A wordline address decoder 606 sending a decoded address based on the address input 602 to a wordline driver 612. The multi-power regulator 608 receives power control signals from the bitline address calculating circuit 604 and sends a selected power to the wordline driver 612 according the decoded address and a loading condition of the wordline. The wordline driver 612 will generate a driving waveform with voltage offset to drive the selected wordline. The waveform with voltage offset may be resembled to the selected wordline 616 to speed up the pre-charge operation.

Similarly, as shown in FIG. 6B, the memory pre-charge circuit comprises a wordline address calculating circuit 626 calculates a distance from the driver of bitline and sending power control signals based on the address input 602 to a multi-power regulator 608 and supply the selected power to bitline driver 610. A bitline address decoder 624 sending a decoded address based on the address input 602 to a bitline driver 610. The multi-power regulator 608 receives power control signals from the wordline address calculating circuit 626 and sends a selected power to the bitline driver 610 according to the decoded address and a loading condition of the bitline. The bitline driver 610 will generate a driving waveform with voltage offset to drive the selected bitline 614. The waveform with the voltage offset may correspond to the selected bitline 614 to speed up pre-charge operation as previously described.

In operation, when driving a selected wordline, bitline decoder and wordline decoder are decode for selecting the addresses of a particular bitline and wordline, respectively. The wordline address decoder then sends a decoded address to a wordline driver, while the multiple power regulator of the present invention received control signals from the bitline address calculating circuit and sends a selected power to the wordline driver. Finally, the wordline driver of the present invention provides the power to a selected wordline previously as described as shown in the FIG. 6A.

Similarly, when driving a selected wordline, bitline decoder and wordline decoder are decoded for selecting the addresses of a particular bitline and wordline, respectively. The bitline address decoder then send a decoded address to a bitline driver, while the multiple power regulator of the present invention received power control signals from the wordline address calculating circuit and sends a selected power to the bitline driver as well. Finally, the bitline driver provides the power to a selected wordline as previously described.

According to the dynamic multiple power regulator of the present invention, it offers a lot of the advantages over the prior art:
1. The power voltage supplied to the different sections in wordline or bitline transition is different, the transition speed of wordline or bitline may be dynamically adjusted.
2. Using the present invention, one wordline driver may drive less double loading than the wordline driver with fixed power supply.
3. Using the present invention, the MOS width of the wordline driver may also be decreased to a minimum rule of for example 1 um.
4. Both the wordline and bitline may use the dynamic multiple power regulator of the present invention.

While the invention has been particularly shown and described with reference to some preferred embodiments, it will be understood by those skilled in the art that various changes in form and details may be made therein without departing from the spirit and scope of the present invention.

What we claimed is:

1. A pre-charge circuit for an integrated circuit memory device, comprising:
    an address calculating unit to detect a loading of said integrated circuit memory device; and a driver to provide a voltage to said loading of said integrated circuit memory device based on an output of said address calculating unit.

2. The pre-charge circuit for an integrated circuit memory device according to claim 1, wherein said loading is a wordline.

3. The pre-charge circuit for an integrated circuit memory device according to claim 1, wherein said loading is a bitline.

4. The pre-charge circuit for an integrated circuit memory device according to claim 1, wherein said loading can be defined with a plurality of sectors.

5. The pre-charge circuit for an integrated circuit memory device according to claim 4, wherein said driver provides said voltage with multiple voltage levels to said loading.

6. The pre-charge circuit for an integrated circuit memory device according to claim 4, wherein said driver provides a higher voltage level to a sector with a heavier loading or with a longer distance from driver.

7. The pre-charge circuit for an integrated circuit memory device according to claim 1, wherein said driver dynamically changes a voltage level of said voltage to said loading.

8. A method of providing a power to a pre-charge circuit for an integrated circuit memory device, comprising the steps of:
    decoding an address of a line to be provided said power;
    detecting a loading of said line; and
    providing a voltage to said line based on said loading.

9. The method according to claim 8, wherein said line is a wordline.

10. The method according to claim 8, wherein said line is a bitline.

11. The method according to claim 8, further comprises a step of calculating a distance from a driver of said line.

12. The method according to claim 8, wherein said line can be defined to have a plurality of sectors.

13. The method according to claim 12, wherein said voltage comprises multiple voltage levels.

14. The method according to claim 12, wherein a higher voltage level is provided to a sector with a heavier loading.

15. The method according to claim 11, wherein a higher voltage level is provided to a sector with a longer distance from said driver.

16. The method according to claim 8, wherein said voltage to said loading is dynamically changed to a voltage level.

17. A method of providing a power to a pre-charge circuit for an integrated circuit memory device, comprising the steps of:
    decoding an address of a wordline to be provided said power;
    detecting a loading of said wordline; and
    providing a voltage to said wordline based on said loading.

18. The method according to claim 17, further comprises a step of calculating a distance from a driver of said line.

19. The method according to claim 17, wherein said detecting is performed by a bitline address calculating circuit.

20. The method according to claim 19, wherein said providing a voltage to said wordline is performed by a wordline multi-power driver.

21. The method according to claim 17, wherein said wordline has a plurality of sectors.

22. The method according to claim 21, wherein said voltage comprises multiple voltage levels.

23. The method according to claim 21, wherein a higher voltage level is provided to a sector with a heavier loading.

24. The method according to claim 18, wherein a higher voltage level is provided to a sector with a longer distance from said driver.

25. The method according to claim 17, wherein said voltage to said loading is dynamically changed to a voltage level.

26. A method of providing a power to a pre-charge circuit for an integrated circuit memory device, comprising the steps of:
    decoding an address of a bitline to be provided said power;
    detecting a loading of said bitline; and
    providing a voltage to said bitline based on said loading.

27. The method according to claim 26, further comprises a step of calculating a distance from a driver of said line.

28. The method according to claim 26, wherein said detecting is performed by a wordline address calculating circuit.

29. The method according to claim 26, wherein said providing a voltage to said bitline is performed by a bitline multi-power driver.

30. The method according to claim 26, wherein said bitline has a plurality of sectors.

31. The method according to claim 30, wherein said voltage comprises multiple voltage levels.

32. The method according to claim 30, wherein a higher voltage level is provided to a sector with a heavier loading.

33. The method according to claim 27, wherein a higher voltage level is provided to a sector with a longer distance from said driver.

34. The method according to claim 26, wherein said voltage to said loading is dynamically changed to a voltage level.

* * * * *